United States Patent
Nonaka et al.

(10) Patent No.: US 7,814,954 B2
(45) Date of Patent: *Oct. 19, 2010

(54) SHEET STICKING APPARATUS AND STICKING METHOD

(75) Inventors: Hideaki Nonaka, Tokyo (JP); Kenji Kobayashi, Tokyo (JP)

(73) Assignee: Lintec Corporation, Tokyo (JP)

( * ) Notice: Subject to any disclaimer, the term of this patent is extended or adjusted under 35 U.S.C. 154(b) by 184 days.

This patent is subject to a terminal disclaimer.

(21) Appl. No.: 12/090,202

(22) PCT Filed: Oct. 25, 2006

(86) PCT No.: PCT/JP2006/321223

§ 371 (c)(1),
(2), (4) Date: Apr. 14, 2008

(87) PCT Pub. No.: WO2007/060803

PCT Pub. Date: May 31, 2007

(65) Prior Publication Data

US 2009/0229735 A1    Sep. 17, 2009

(30) Foreign Application Priority Data

Nov. 24, 2005  (JP) .............................. 2005-338920

(51) Int. Cl.
 *B32B 37/10* (2006.01)
(52) U.S. Cl. ........................................ 156/378; 156/64
(58) Field of Classification Search ................. 156/378, 156/64

See application file for complete search history.

(56) References Cited

U.S. PATENT DOCUMENTS 6,238,515 B1 * 5/2001 Tsujimoto et al. ......... 156/379.8

FOREIGN PATENT DOCUMENTS

| JP | 04-293253 A | 10/1992 |
| JP | 06032522 A * | 2/1994 |
| JP | 2004-047976 A | 2/2004 |
| JP | 2005136306 A * | 5/2005 |
| JP | 2005-236049 A | 9/2005 |

OTHER PUBLICATIONS

PCT/JP2006/321223 International Search Report and English Translation.

* cited by examiner

*Primary Examiner*—Khanh Nguyen
*Assistant Examiner*—John Blades
(74) *Attorney, Agent, or Firm*—Lowe, Hauptman, Ham & Berner, LLP

(57) ABSTRACT

A sheet sticking apparatus 10 comprises a sheet feed-out unit 12 that feeds out an adhesive sheet S to a position facing a surface of a semiconductor wafer W and a press roller 14 that presses the adhesive sheet S to stick the adhesive sheet S onto the wafer W. The sheet feed-out unit 12 includes a tension measuring means 35 for measuring a tension of the adhesive sheet S between the sheet feed-out unit 12 and the press roller 14 and a sticking angle maintaining means 37 provided with a feed-out head 49 for maintaining a sticking angle θ. After measuring and adjusting the tension immediately before sticking the adhesive sheet S, the feed-out head 49 is lowered in proportion to the movement amount of the press roller 14, thereby the sticking angle θ is maintained, and thus the tension is maintained at a constant level.

6 Claims, 5 Drawing Sheets

SHEET STICKING APPARATUS AND STICKING METHOD

RELATED APPLICATIONS

The present application is based on, and claims priority from International Application No. PCT/JP2006/321223, filed Nov. 24, 2005 and Japan Application Number 2005-338920, filed Nov. 24, 2005, the disclosures of which are hereby incorporated by reference herein in their entirety.

FIELD OF THE INVENTION

The present invention relates to a sheet sticking apparatus and a sticking method, particularly to a sheet sticking apparatus and a sticking method capable of sticking a sheet, when sticking a sheet to a plate-like object such as a semiconductor wafer, precisely to a predetermined position of the object.

BACKGROUND OF THE ART

Conventionally, semiconductor wafers (hereinafter, simply referred to as "wafer") are stuck with a protective sheet for protecting circuit surface thereof, and stuck with an adhesive sheet for die bonding on the rear surface thereof.

As the sheet sticking method described above, the following sticking method is known. That is, using a raw strip sheet in which a strip of adhesive sheet is temporarily stuck on a strip of release liner, the adhesive sheet is peeled off from the release liner, stuck onto a wafer, and then cut off along the periphery of the wafer (refer to, for example, patent document 1).

Patent document 1: Japanese Patent Application Laid-Open No. 2004-47976

SUMMARY OF THE INVENTION

Problem to be Solved by the Invention

However, in a sheet sticking apparatus disclosed in the patent document 1, there has not been positively employed such an arrangement so as to maintain constant tension during the operation of sticking an adhesive sheet onto a wafer.

Therefore, when the adhesive sheet is stuck with shortage of tension, such disadvantages may be resulted in that wrinkles are generated on the adhesive sheet and/or air bubbles are caught between the adhesive sheet and the wafer. On the other hand, when an excessive tension is given to the adhesive sheet, such a disadvantage may be brought in that warp deformation is caused on the wafer after sticking the adhesive sheet.

Also, in the sheet sticking apparatus disclosed in the patent document 1, a set of guide rollers 28 for feeding out the adhesive sheet to a position facing the surface of the wafer is disposed. Since the guide rollers 28 nip constantly the adhesive sheet throughout sticking operation, cutting operation and peeling operation of the adhesive sheet, a line-like dent portion is formed on the adhesive layer of the adhesive sheet. Therefore, in the case of plate-like object such as the wafer, which is subjected to a grinding process to obtain an extremely thin thickness of several dozen micron, a sheet with a trace of line-like dent portion may cause an unevenness in thickness, or breakage of wafer in the grinding process. Thus, the area with the dent portion cannot be used for the area to be stuck to the wafer. Although the sheet can be fed so that the area with the dent portion is excluded, that case causes such a disadvantage that the sheet is consumed wastefully.

OBJECT OF THE INVENTION

The present invention has been proposed in view of the above disadvantages. It is an object of the present invention to provide a sheet sticking apparatus and a sticking method capable of measuring the tension of a sheet immediately before sticking the sheet to a plate-like object, and sticking the sheet with a predetermined preset tension.

Also, another object of the present invention is to provide a sheet sticking apparatus and a sticking method capable of significantly suppressing wasteful consumption of the sheet by feeding the sheet of a length corresponding to the size of the plate-like object.

Means for Solving Problems

In order to achieve the above object, the present invention adopts such an arrangement that a sheet sticking apparatus, comprising: a sheet feed-out unit for feeding out a sheet to a position facing a surface of a plate-like object; and a press roller for imparting a press force to the sheet to stick the sheet from one end toward the other end of the plate-like object, wherein the sheet feed-out unit is provided with a tension measuring means for measuring a tension of the sheet between the sheet feed-out unit and the press roller, and a sticking angle maintaining means including a feed-out head movable in such a direction that a sticking angle of the sheet is constantly maintained with respect to the plate-like object, wherein the tension measuring means measures the tension immediately before sticking the sheet to the plate-like object by means of the press roller, and the feed-out head of the sticking angle maintaining means moves in proportion to a relative movement amount of the press roller with respect to the plate-like object to maintain the sticking angle substantially constant, and thus the tension of the sheet is maintained at a substantially constant level.

The present invention adopts such an arrangement that the tension measuring means adjusts the sheet tension to a predetermined preset tension by changing the position of the feed-out head when any excess or shortage of the tension is detected with respect to the predetermined preset tension.

Further, in the sheet feed-out unit, it is preferable to include a peel plate, the length of the sheet fed out between the front end of the peel plate and the press roller being set to be a little longer than the length from the one end to the other end of the plate-like object.

Further, the present invention adopts such a sheet sticking method, in which a sheet is fed out from a sheet feed-out unit and the sheet is pressed by a press roller to stick the same onto a plate-like object, comprising the steps of: measuring a tension of the sheet with a tension measuring means immediately before the press roller presses the sheet to stick the same, and then sticking the sheet onto the plate-like object by moving the plate-like object and the press roller relatively so as to maintain a constant sheet-sticking angle with respect to the plate-like object.

In the forementioned method, such a method is also adopted that the sheet is adjusted so that the predetermined preset tension is obtained when any excess or shortage is detected with respect to a predetermined preset tension in the tension measured immediately before the sticking.

Furthermore, the above method preferably adopts such a method that the sheet is stuck in a state that the length of the sheet fed out from the sheet feed-out unit to the press roller is kept a little longer than the length from the one end to the other end of the plate-like object.

EFFECT OF THE INVENTION

According to the present invention, such an arrangement is adopted that the tension measuring means measures the tension of the sheet immediately before sticking the sheet onto the plate-like object. Owing to this measurement, whether or not there is excess or shortage of tension with respect to the preset tension can be detected. When any excess or shortage is detected, the position of the feed-out head is adjusted so that the preset tension is obtained, and thereby the sticking angle is also determined simultaneously. After that, the feed-out head is moved in proportion to the relative movement amount of the press roller with respect to the plate-like object to maintain the constant sticking angle. As a result, the sticking of the sheet can be carried out while keeping the constant tension of the sheet. Therefore, no slack is generated on the sheet nor excessive tension is imparted thereto during sticking operation. Problems such as wrinkle generation, air bubble capture, and warp deformation of the plate-like object can be prevented.

Moreover, since the feed-out head of the sticking-angle maintaining means moves in proportion to the relative movement amount of the press roller with respect to the plate-like object, the tension adjusted before the sticking is constantly maintained thereafter. Owing to this, the sheet sticking can be carried out precisely.

Furthermore, the sticking is carried out in a state that the length of the sheet fed out between the front end of the peel plate and the press roller is set to be a little longer than the length from the one end to the other end of the plate-like object. Therefore, the area of the sheet continuing to the vicinity of the other end of the plate-like object can be used as the area to be stuck onto the next plate-like object. Accordingly, unused area or margin between the sheet areas stuck on the plate-like objects can be minimized, and thus wasteful consumption of the sheet can be eliminated.

Figure 1:
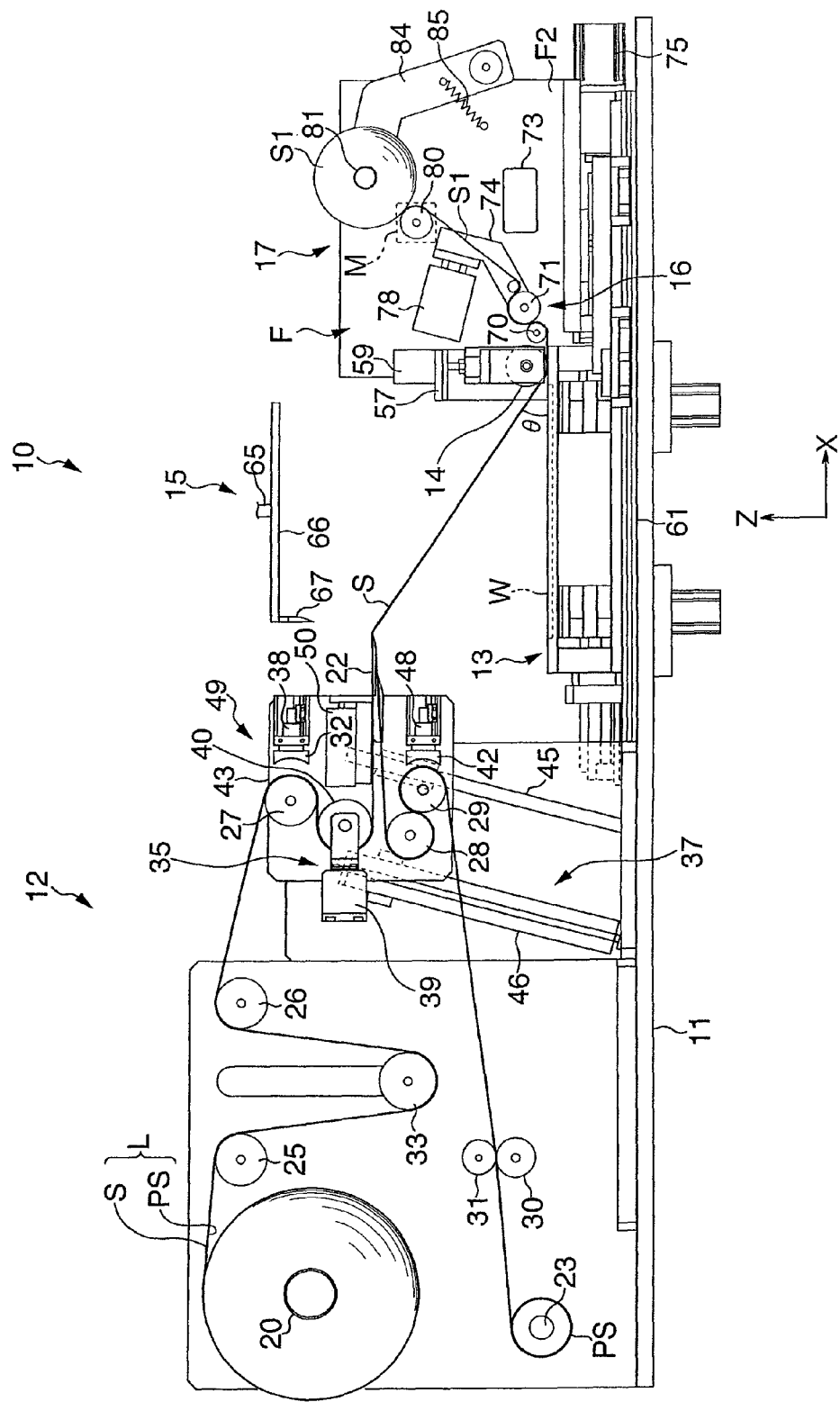
FIG. 1 is a front view schematically showing a sheet sticking apparatus in accordance with the embodiment.

EXPLANATION OF REFERENCE NUMERALS 10 sheet sticking apparatus
12 sheet feed-out unit
14 press roller
35 tension measuring means
39 load cell
40 tension measuring roller
37 sticking-angle maintaining means
S adhesive sheet
W wafer (plate-like object)
θ sticking angle

DESCRIPTION OF THE PREFERRED EMBODIMENTS

Hereinafter, embodiments of the invention will be described with reference to the drawings.

Figure 2:
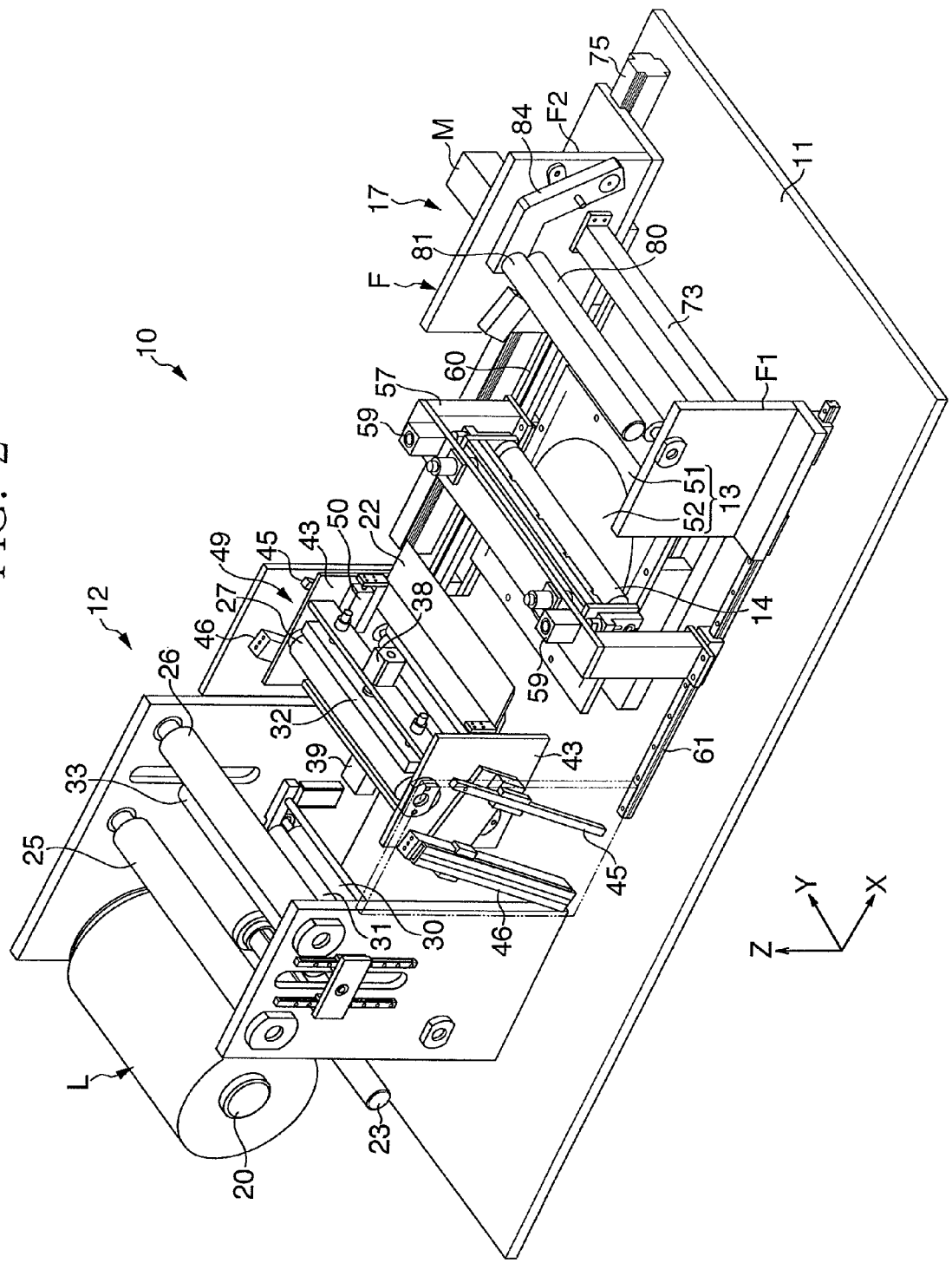
FIG. 2 is a perspective view schematically showing the sheet sticking apparatus.

FIG. 1 is a front view schematically showing a sheet sticking apparatus according to the embodiment; and FIG. 2 is a schematic perspective view thereof. In these figures, a sheet sticking apparatus 10 comprises: a sheet feed-out unit 12 disposed in the upper portion of a base 11; a table 13 for supporting a wafer W as a plate-like object; a press roller 14 for imparting a press force to an adhesive sheet S fed out to the upper surface side of the wafer W to stick the adhesive sheet S to the wafer W; a cutter 15 for cutting the adhesive sheet S along the outer periphery of the wafer W after sticking the adhesive sheet S to the wafer W; a peeling device 16 for peeling off unnecessary adhesive sheet S1 outside the wafer W from the upper surface of the table 13; and a winding device 17 for winding the unnecessary adhesive sheet S1.

The sheet feed-out unit 12 comprises: a support roller 20 for supporting a rolled raw strip sheet L in which the strip of adhesive sheet S is temporarily stuck on one surface of a strip of a release liner PS; a peel plate 22 with which the raw strip sheet L fed out from the support roller 20 is sharply folded back to peel off the adhesive sheet S from the release liner PS; a collection roller 23 for collecting the release liner PS by winding the same; a plurality of guide rollers 25 to 31 disposed between the support roller 20 and the collection roller 23; a buffer roller 33 disposed between the guide rollers 25 and 26; a tension measuring means 35 disposed between the guide rollers 27 and 28; and a sticking-angle maintaining means 37 for constantly maintaining a sticking angle θ of the adhesive sheet S to the wafer W in corporate with the press roller 14. Note that the guide rollers 27 and 29 are concomitantly provided with brake shoes 32 and 42 respectively. These brake shoes 32 and 42 are arranged so as, when sticking the adhesive sheet S to the wafer W, to be moved toward/away from the corresponding guide roller 27, 29 by means of cylinders 38 and 48 respectively, to nip the adhesive sheet S to restrain the feeding thereof.

The tension measuring means 35 comprises a load cell 39 and a tension measuring roller 40 supported by the load cell 39 and located at the base side of the peel plate 22. The tension measuring roller 40 is arranged to transmit a tension acting on the adhesive sheet S, which is nipped by the guide rollers 27 and 29 and the brake shoes 32 and 42, and fed out by a vertical movement of a feed-out head 49, which will be described later, between the sheet feed-out unit 12 and the press roller 14, to the load cell 39.

The sticking-angle maintaining means 37 comprises: a feed-out head 49 including guide rollers 27, 28 and 29, the load cell 39, the tension measuring roller 40, brake shoes 32 and 42, cylinders 38 and 48, the peel plate 22 and a pair of slide plates 43 and 43 for supporting above items; a pair of guide rails 45 for vertically guiding the feed-out head 49; and a pair of uniaxial robots 46 for imparting a force to the feed-out head 49 to move in the vertical direction. The guide rails 45 and the uniaxial robots 46 are disposed in an inclined posture, and the feed-out head 49 is arranged to be movable in the vertical direction along the inclined angle. The load cell 39 measures the tension immediately before sticking the adhesive sheet S. And the feed-out head 49 is arranged so as to move in the vertical direction to adjust the tension when any excess or shortage is detected with respect to the preset tension. Note that the peel plate 22 is supported by a cylinder 50 disposed at the inner side of the slide plates 43 enabling to move forward and backward in the X-direction in FIG. 1.

Owing to this, the front edge position of the peel plate 22 can be adjusted in accordance with the diameter of the wafer W.

Figure 3:
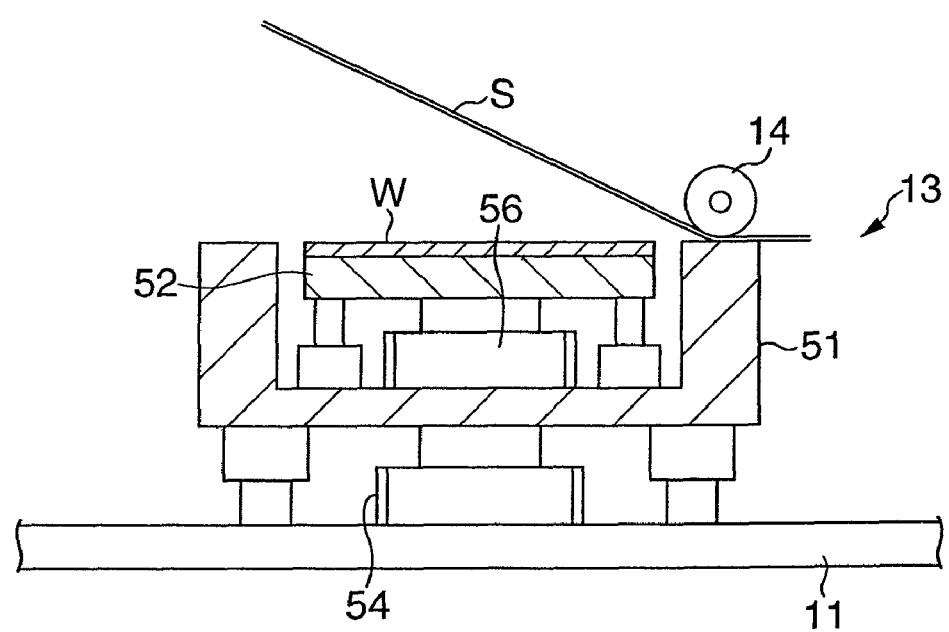
FIG. 3 is a cross sectional view schematically showing a table.

As shown in FIG. 3, the table 13 comprises: an outer table 51 having a substantially square shape in plane view; and an inner table 52 having a substantially circular shape in plane view. The outer table 51 is configured in a concave-shape so as to receive the inner table 52, and is arranged so as to move in the vertical direction with respect to the base 11 via a uniaxial robot 54. On the other hand, the inner table 52 is arranged so as to move in the vertical direction with respect to the outer table 51 via a uniaxial robot 56. Accordingly, the outer table 51 and the inner table 52 are arranged so as to move integrally in the vertical direction as well as to move in the vertical direction independently each other. Owing to this, the outer table 51 and the inner table 52 are arranged to be adjustable to a predetermined level position corresponding to the thickness of the adhesive sheet S and the wafer W.

The press roller 14 is supported via a portal frame 57. On the upper face side of the portal frame 57, cylinders 59, 59 are provided. The press roller 14 is arranged so as to move in the vertical direction owing to the operation of these cylinders 59. Incidentally, as shown in FIG. 2, the portal frame 57 is arranged to be movable in the X-direction in FIG. 1 via the uniaxial robot 60 and a guide rail 61.

The cutter 15 is provided movably in the vertical direction via a lifter (not shown) above the table 13. The cutter 15 comprises: a rotation arm 66 fixed to a rotation center shaft 65, and a cutter blade 67 supported by the rotation arm 66. When the cutter blade 67 is rotated around the rotation center shaft 65, the adhesive sheet S can be cut along the outer periphery of the wafer W.

As shown in FIGS. 1, 4 and 5, the peeling device 16 comprises a small diameter roller 70 and a large diameter roller 71. A moving frame F supports the small diameter roller 70 and the large diameter roller 71. The moving frame F comprises a front frame F1 and a rear frame F2, which are opposing to each other in the Y-direction in FIG. 2, the rear frame F2 being connected to the front frame F1 via a connecting member 73. The rear frame F2 is supported by a uniaxial robot 75, while the front frame F1 is supported by the guide rail 61. Owing to this, the moving frame F is movable in the X-direction in FIG. 2. An arm member 74 supports the large diameter roller 71 as shown in FIG. 1. The arm member 74 is arranged so that a cylinder 78 can move the large diameter roller 71 in the direction closer to/away from the small diameter roller 70.

The winding device 17 comprises: a drive roller 80 supported by the moving frame F; and a winding roller 81, which is supported at the free-end of the rotation arm 84 being abutted on the circumferential surface of the drive roller 80 via a spring 85 to nip the unnecessary adhesive sheet S1. A drive motor M is disposed at the shaft end of the drive roller 80, which rotates by operation of the motor M synchronized with the movement of the moving frame F, the winding roller 81 follows the drive roller 80 to rotate; thereby the unnecessary adhesive sheet S1 is wound thereon. Note that as the wound amount increases, the winding roller 81 shifts rightward in FIG. 1 against the force of the spring 85.

Next, the sticking method of the adhesive sheet S in accordance with the embodiment will be described with reference to FIGS. 4 and 5 as well.

In the initial setting, in the raw strip sheet L, which is fed out from the support roller 20, the adhesive sheet S is peeled off from the release liner PS at the front edge position of the peel plate 22, and the lead end of the release liner PS is fixed to the collection roller 23 through the guide rollers 28, 29. On the other hand, the lead end of the adhesive sheet S is fixed to the winding roller 81 of the winding device 17 through the press roller 14 and the peeling device 16. Here, the position of the front end of the peel plate 22 is adjusted by the cylinder 50 so that the length of the adhesive sheet S between the peel plate 22 and the press roller 14 is a little longer than the length from the one end to the other end, i.e., from the right end to the left end of the wafer W in FIG. 4.

In a state that the wafer W is set on the table 13 by means of a transfer arm (not shown), the sticking operation starts. Almost simultaneously, the brake shoes 32 and 42 come to abut on the guide rollers 27 and 29 to restrain feeding out of the adhesive sheet S. And the load cell 39 measures the tension of the adhesive sheet S between the sheet feed-out unit 12 and the press roller 14 via the tension measuring means 40 immediately before the sticking operation. Here, when any excess or shortage is detected with respect to the preset tension, the feed-out head 49 is moved in the vertical direction so that the position thereof is adjusted to obtain the preset tension. When the preset tension has been obtained, the sticking angle θ is determined (refer to FIG. 4(A)). And then, in a state that the table 13 is in a rest, the press roller 14 moves on the wafer W relatively thereto leftward in FIG. 4, while rotating.

Figure 4A:
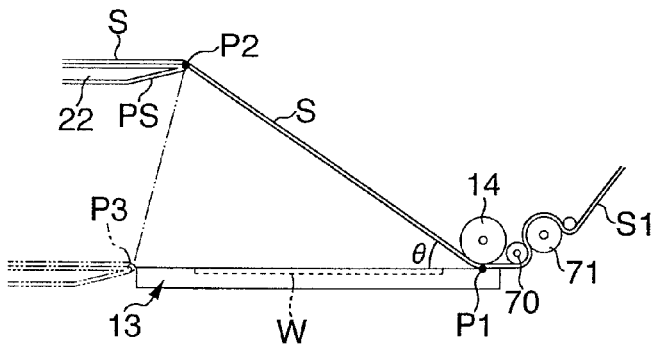
FIGS. 4(A) to 4(E) are explanatory views showing sticking operation of adhesive sheet.
Figure 4B:
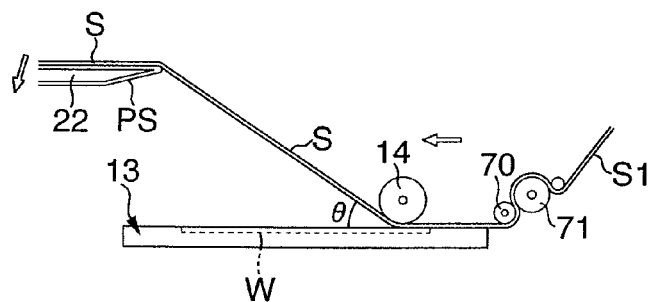
Figure 4C:
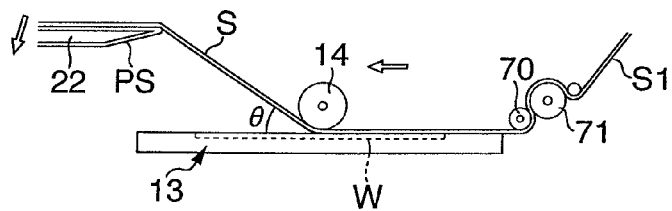

When the press roller 14 moves relative to the wafer W, as shown in FIG. 4(A), assuming that the lower most position of the press roller 14 and the front edge position of the peel plate 22 at the start point of the sticking operation be P1 and P2 respectively; the front edge position of the peel plate 22 at the point when the sticking operation of the adhesive sheet S has been completed be P3; the uniaxial robots 46 and 60 are controlled synchronously to lower the feed-out head 49 constituting the sticking-angle maintaining means 37 along the guide bars 45 so that, as the press roller 14 moves and the distance between the points P1 and P3 is made smaller by the uniaxial robot 60, the level of the peel plate 22 becomes lower, that is the distance between the points P2 and P3 also becomes shorter, and thus the sticking angle θ is constantly maintained.

Figure 4D:
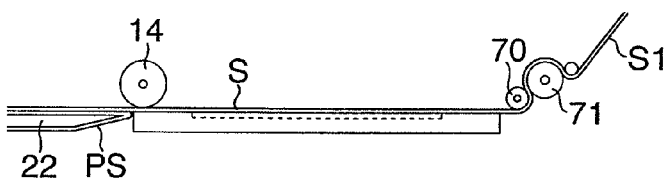
Figure 4E:
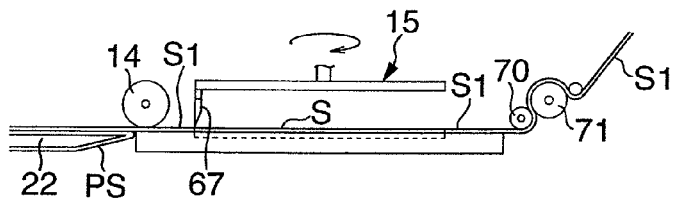
Figure 5A:
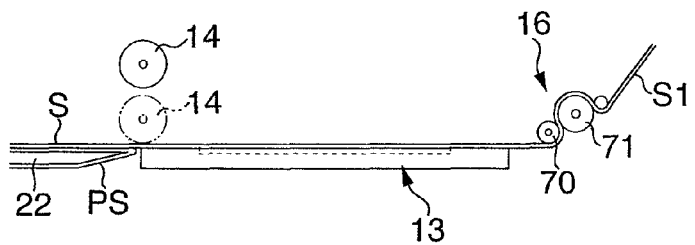
FIGS. 5(A) to 5(D) are explanatory views showing peeling operation of unnecessary adhesive sheet by a peeling apparatus.
Figure 5B:
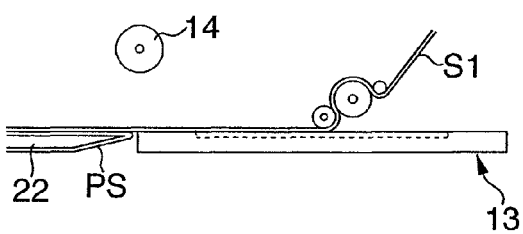
Figure 5C:
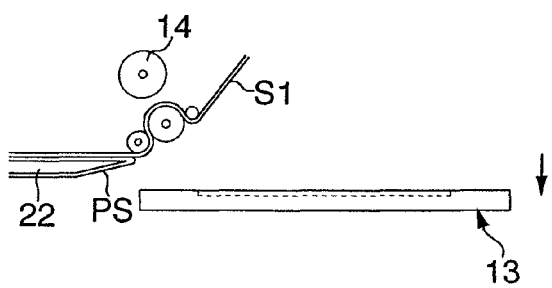
Figure 5D:
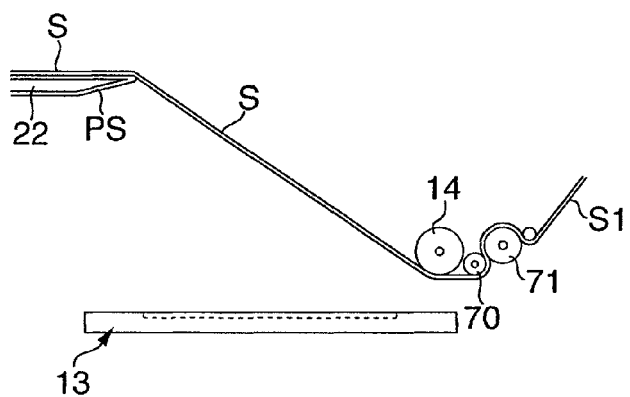

As shown in FIGS. 4(D) and 4(E), when the sticking operation of the adhesive sheet S has been completed, the cutter 15 descends to cut the adhesive sheet S along the peripheral edge of the wafer W, and then the cutter 15 goes up to return to the initial position (refer to FIG. 1). At this time, the front end of the peel plate 22 is positioned in the vicinity of the left end of the wafer W. Owing to this, the area of the adhesive sheet existing at the left side from the front edge position of the peel plate 22 can be used as the area to be stuck to the next wafer W, thus the adhesive sheet S is prevented from being consumed wastefully.

Thereafter, when the wafer W is removed from the table by means of a transfer device, the press roller 14 goes up as shown in FIG. 5, and the moving frame F is driven by the uniaxial robot 75 to move leftward in FIG. 1. At this time, the small diameter roller 70 and the large diameter roller 71 of the peeling device 16 peel off the unnecessary adhesive sheet S1 from the table 13. And the drive roller 80 of the winding device 17 is synchronously driven in accordance with the uniaxial robot 75 and winds the unnecessary adhesive sheet S1, thus the unnecessary adhesive sheet S1 around the wafer W is peeled off from the upper face of the table 13.

Then, the brake shoes 32 and 42 are detached from the guide rollers 27 and 29 to allow the raw strip sheet L to be fed out; and in a state that the drive roller 80 is locked, the peeling device 16 and the winding device 17 return to the original position. And when the position of the feed-out head 49 is raised and lowered, a new adhesive sheet S is pulled out, and a new wafer W is transferred onto the table 13 again (refer to FIG. 5(D)).

Therefore, according to the above-described embodiment, the feed-out head 49 of the sticking-angle maintaining means 37 lowers in proportion to the relative movement amount of the press roller 14 with respect to the wafer W, and thus, the sticking angle θ can be maintained at a constant angle. Consequently, with the condition that the tension is measured immediately before starting the adhesive sheet S and adjusted to the preset tension, such advantage can be obtained that the adhesive sheet S can be stuck to the wafer W while maintaining the preset tension.

The best arrangement, method and the like for carrying out the present invention have been disclosed so far. However, the present invention is not limited to the above.

That is, the present invention has been illustrated and described mainly about a specific embodiment. However, it is possible for those skilled in the art to add various modifications, if necessary, to the above-described embodiment with respect to the shape, position and/or disposition without departing from the technical spirit and the range of the object of the present invention.

For example, in the above-described embodiment, the case where the press roller 14 is moved to stick the adhesive sheet S in a state that the table 13 is at a standstill has been illustrated and described. However, such arrangement that the table 13 is caused to move may be employed. Also, the sticking angle θ is not particularly limited.

Also, in the above-described embodiment, the plate-like object is targeted to the wafer W. However, the plate-like object in the present invention is not limited to semiconductor wafer W. A plate made of glass, steel, resin or other plate-like objects may be deemed to be targeted objects. The semiconductor wafer may be silicon wafer and compound wafer as well. Moreover, the plate-like object is not limited to a circular article, but may be a polygonal article.

The invention claimed is:

1. A sheet sticking apparatus, comprising: a sheet feed-out unit for feeding out a sheet to a position facing a surface of a plate-shaped object; and a press roller for imparting a press force to said sheet to stick the sheet from one end toward the other end of the plate-shaped object, wherein said sheet feed-out unit is provided with a tension measuring means for measuring a tension of the sheet between said sheet feed-out unit and said press roller, and a sticking angle maintaining means including a feed-out head movable in such a direction that a sticking angle of the sheet is constantly maintained with respect to said plate-shaped object, wherein said tension measuring means measures the tension immediately before sticking the sheet to the plate-shaped object by means of said press roller, and the feed-out head of said sticking angle maintaining means moves in proportion to a relative movement amount of the press roller with respect to said plate-shaped object to maintain the sticking angle substantially constant, thus the tension of the sheet is maintained at a substantially constant level.

2. The sheet sticking apparatus according to claim 1, wherein said tension measuring means adjusts said sheet to a preset tension by changing the position of said feed-out head when any excess or shortage is detected with respect to the predetermined preset tension.

3. The sheet sticking apparatus according to claim 1, wherein said sheet feed-out unit includes a peel plate, the length of the sheet fed out between the front end of the peel plate and the press roller being set to be a little longer than the length from the one end to the other end of the plate-shaped object.

4. A sheet sticking method, in which a sheet is fed out from a sheet feed-out unit and the sheet is pressed by a press roller to stick the same onto a plate-shaped object, comprising the steps of: measuring a tension of the sheet with a tension measuring means immediately before said press roller sticks the sheet, and then moving a sheet feed-out head in proportion to a relative movement amount of the press roller with respect to said plate-shaped object to maintain a substantially constant sticking angle, thereby maintaining a substantially constant sheet tension level.

5. The sheet sticking method according to claim 4, wherein said sheet is adjusted so that the preset tension is obtained when any excess or shortage of tension is detected with respect to a predetermined preset tension in the tension measured immediately before said sticking.

6. The sheet sticking method according to claim 4, wherein the sheet is stuck in a state that a length of the sheet fed out from said sheet feed-out unit to the press roller is kept a little longer than a length from the one end to the other end of said plate-shaped object.

\* \* \* \* \*